(12) United States Patent
Kegeler

(10) Patent No.: US 10,012,267 B2
(45) Date of Patent: Jul. 3, 2018

(54) RESOLVER BEARING, RESOLVER STATOR, AND METHOD FOR PRODUCING SAME

(71) Applicant: Schaeffler Technologies AG & Co. KG, Herzogenaurach (DE)

(72) Inventor: Joerg Kegeler, Schleusingen (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

(21) Appl. No.: 15/313,468

(22) PCT Filed: Feb. 17, 2015

(86) PCT No.: PCT/DE2015/200082
§ 371 (c)(1),
(2) Date: Nov. 22, 2016

(87) PCT Pub. No.: WO2015/180711
PCT Pub. Date: Dec. 3, 2015

(65) Prior Publication Data
US 2017/0152894 A1    Jun. 1, 2017

(30) Foreign Application Priority Data

May 26, 2014    (DE) .................. 10 2014 210 014

(51) Int. Cl.
*G01B 7/30* (2006.01)
*F16C 41/00* (2006.01)
(Continued)

(52) U.S. Cl.
CPC .......... *F16C 41/007* (2013.01); *G01D 5/2046* (2013.01); *G01D 11/245* (2013.01);
(Continued)

(58) Field of Classification Search
CPC ....... G01B 7/30; F16C 41/007; G01D 5/2046; G01D 11/245
(Continued)

(56) References Cited

U.S. PATENT DOCUMENTS 6,777,843 B2 *  8/2004  Hayashi ................ H02K 11/21
                                                  310/168
6,998,951 B2    2/2006  Itou et al.
(Continued)

FOREIGN PATENT DOCUMENTS

DE          10354694        6/2005
JP         2010249743       1/2010
(Continued)

*Primary Examiner* — Reena Aurora
(74) *Attorney, Agent, or Firm* — Davidson, Davidson & Kappel, LLC

(57) ABSTRACT

A resolver bearing with an angle sensor to detect the angular position of the bearing rings. The angle sensor includes an annular resolver stator connected to one of the bearing rings and includes a transmission coil and a receiving coil designed as printed circuits on a multilayer printed circuit board. The transmission coil is arranged at least partly within a U-shaped shell core, and the receiving coil is arranged at least partly within and at least partly outside of the shell core. The angle sensor also has a resolver rotor rotationally fixed to the other of the two bearing rings and includes magnetically conductive components. The resolver rotor is arranged at least partly within the U-shaped shell core. A signal can be transmitted between the transmission coil and the receiving coil via a magnetic circuit. An angular position-dependent variable reluctance in the magnetic circuit can be specified by the resolver rotor. The shell core is made of magnetically conductive structures integrated into the multilayer printed circuit board.

10 Claims, 4 Drawing Sheets

(51) Int. Cl.
*G01D 11/24* (2006.01)
*G01D 5/20* (2006.01)
*H05K 1/16* (2006.01)
*H05K 3/46* (2006.01)

(52) U.S. Cl.
CPC ............... *H05K 1/165* (2013.01); *H05K 3/46* (2013.01); *F16C 2233/00* (2013.01); *H05K 2201/086* (2013.01)

(58) Field of Classification Search
USPC .......................................... 324/173, 207.25
See application file for complete search history.

(56) References Cited

U.S. PATENT DOCUMENTS

| | | | |
|---|---|---|---|
| 8,664,949 B2 * | 3/2014 | Takei | F16C 41/007 324/207.25 |
| 9,329,022 B2 | 5/2016 | Kegeler et al. | |
| 2015/0300412 A1 | 10/2015 | Kegeler | |

FOREIGN PATENT DOCUMENTS

| WO | WO 2011/134955 A2 | 11/2011 |
|---|---|---|
| WO | WO02014037004 | 3/2014 |

* cited by examiner

RESOLVER BEARING, RESOLVER STATOR, AND METHOD FOR PRODUCING SAME

The present invention relates to a resolver bearing and to a resolver stator. The present invention also relates to a method for manufacturing a resolver stator.

BACKGROUND

A resolver is generally understood to mean an electromagnetic transducer for converting the angular position of a rotor into an electrical variable. The term resolver bearing denotes arrangements which include a rolling bearing with an integrated angle sensor.

WO 2014/037004 A1 describes a resolver bearing including an inner ring, an outer ring and rolling bodies which are situated in the annular space formed between the bearing rings. Two annular disks, which are each connected rotatably fixed to one of the two bearing rings, serve for sealing the annular space. Primary and secondary coils are situated in the annular space. In order to modulate a magnetic flux that is generated by the primary coil in the bearing, the annular disks are each equipped with a segment made of a magnetically permeable material. The magnetic resistance of the corresponding magnetic circuit varies as a result of the variable mutual overlap of the segments during the rotation. Each magnetic circuit has two annular disks, annular coils each running around the axis of rotation as the primary coil and secondary coil, magnetically permeable bearing rings, and a further component (rolling body, short-circuit plate) made of a permeable material provided between the bearing rings.

WO 2011/134955 A2 describes a rolling bearing arrangement including an angle sensor, and also a method for assembling such a rolling bearing arrangement including an angle sensor. The angle sensor has a sensor ring which is connected rotatably fixed to the outer ring, and also a measuring element which is designed as a metal ring that is eccentric relative to the axis of rotation of the rolling bearing and is connected rotatably fixed to the inner ring. As a metallic component, the sensor ring has an annular, U-shaped shell core which is concentric to the axis of rotation of the rolling bearing. A retaining element made of plastic, which is secured in a circumferential groove in the outer ring, is used to mount the shell core and also the sensor ring on the outer ring. Located radially outside of the retaining element is a support ring made of sheet metal which rests against the front side of the outer ring and serves as an assembly aid and also mechanically protects the angle sensor. An annular space for accommodating the sensor ring is formed between the inner surface of the support ring and the retaining element. The sensor ring has a transmission coil which lies in a plane parallel to the front side of the rolling bearing and is situated completely within the U-shaped profile of the shell core. The transmission coil is designed as a printed circuit on a multilayer circuit board. Various receiving coils interact with the transmission coil. Each of the receiving coils is situated partly within the U-shaped profile of the shell core and partly outside of the U-shaped profile. Analogously to the transmission coil, the receiving coils are designed as printed circuits. A signal is transmittable between the transmission coil and the receiving coil via a magnetic circuit, the transmission coil being situated within the U-shaped shell core which forms part of the magnetic circuit. A variable reluctance in the magnetic circuit is established via the measuring element. The metal ring acting as the measuring element closes the magnetic circuit between the legs of the U-shaped shell core. The described angle sensor is made up of many individual components, which entails complicated manufacture (compliance with manufacturing tolerances) and a complicated assembly. Furthermore, it is considered a drawback that such an angle sensor integrated in the rolling bearing considerably increases the width of the rolling bearing in the direction of the axis of rotation, so that more installation space is required.

SUMMARY OF THE INVENTION

It is an object of the present invention to provide a resolver bearing which has a simple design, is easy to manufacture, requires little installation space and, last but not least, also enables more precise angle measurement. Another object is to provide a resolver stator and a method for manufacturing the same.

The resolver bearing according to the present invention includes a bearing inner ring, a bearing outer ring, rolling bodies situated between the bearing rings, and also an angle sensor which is used to detect the relative angular position of the bearing rings with respect to one another. The angle sensor includes an annular resolver stator that is connected to one of the two bearing rings and includes at least one transmission coil and at least one receiving coil which are designed as printed circuits on a multilayer circuit board, the transmission coil being situated at least partly within a U-shaped shell core and the receiving coil is situated partly within and partly outside of the shell core. A further constituent part of the resolver stator is a resolver rotor which is connected rotatably fixed to the other of the two bearing rings and includes magnetically conductive components, the resolver rotor being designed as a ring in such a way that the difference between the internal and external diameter of the ring is different over the circumference. The resolver rotor is situated at least partly within the U-shaped shell core. The axis of rotation of the resolver rotor runs through the center of the resolver stator. A signal is thus transmittable between the transmission coil and the receiving coil via a magnetic circuit. An angular position-dependent variable reluctance in the magnetic circuit is established by the resolver rotor, and the change in the reluctance may be evaluated. It is also essential to the present invention that the shell core is made of magnetically conductive structures which are formed in one piece with the multilayer circuit board.

One significant advantage of the resolver bearing according to the present invention is that, by implementing the shell core in the form of magnetically conductive structures, the shell core becomes a constituent part of the multilayer circuit board that already serves to implement the coils. The combination of a conventional multilayer circuit board with magnetically conductive structures in a circuit board makes it possible to manufacture the resolver stator completely within conventional electrical circuit board manufacture. For this, use may be made of known and time-tested technologies for manufacturing electrical circuit boards, as a result of which a highly efficient production is possible. The production complexity is hereby reduced. The air gaps between the resolver stator and the resolver rotor may be produced in a very precise manner by way of a milling process in circuit board panels. Another advantage may be seen in the fact that, by manufacturing the shell core in the manner according to the present invention, components may be saved and therefore material may be saved and also the machining and assembly complexity is reduced. The separate shell core is thus omitted, as a result of which the components previously required for mounting the shell core are dispensed with. Compared to the approach known previously from WO 2011/134955 A2, the number of components is reduced from eight to three. For example, support rings are no longer required. Due to the reduced stator width, it is possible to apply axial forces directly to the bearing shells.

According to one preferred specific embodiment, in each case a magnetically conductive layer is affixed to the outer layers of the multilayer circuit board. The magnetically conductive layer is preferably laminated onto the multilayer circuit board. The magnetically conductive layers are preferably connected to one another via openings formed in the circuit board, which are filled with a magnetically conductive material. The magnetically conductive material may be, for example, a paste-like material which contains ferromagnetic powder, such as for example iron powder or ferrite powder of various alloys. Paste-like materials are easy to handle and may be introduced into the openings with little effort. The magnetically conductive layer facing toward the bearing rings has a recess for accommodating the resolver rotor. The interconnected magnetically conductive layers form the shell core.

With regard to the design and production of a suitable multilayer circuit board including magnetically conductive layers, reference is made to the applicant's patent application bearing the same date and having the title "Magnetic circuit board and method for producing same." The content of the disclosure of this patent application is in this respect incorporated herein.

Particularly preferred is a specific embodiment in which the magnetically conductive structures made up of multiple spaced-apart angle segments. The division into four angle segments of equal size has proven to be advantageous. Of course, configurations with more than four angle segments are also possible. The design of the magnetically conductive structures made up of multiple angle segments and the spaced-apart installation thereof has the significant advantage that the magnetic resistance within one angle segment is much lower than the resistance at the transition between adjacent angle segments. In this way, the following radial magnetic flux is achieved: radial inner shell core leg—air gap—resolver rotor—air gap—radial outer shell core leg. The magnetic resistance in this magnetic circuit is in this case a series connection of the resistances of the two air gaps and the shell core legs. Given a constant spacing of the shell core legs, the magnetic resistance is independent of shifts of the axis of rotation of the resolver rotor relative to the position of the center of the resolver stator, since the sum of the resistances of the air gaps remains constant if the inner and outer shell core legs have the same length in the circumferential direction.

Alternatively, the magnetically conductive components of the resolver rotor may also be made up of multiple spaced-apart angle segments. The same effect is achieved by the segmented design of the magnetically conductive components of the resolver rotor as was achieved with the segmented design of the magnetically conductive structures of the resolver stator. It is sufficient to make up either the magnetically conductive structures of the resolver stator or the magnetically conductive components of the resolver rotor as multiple spaced-apart angle segments, since the magnetic circuit is hereby split. In the case of a non-segmented design, the result would be an undesirable tangential magnetic flux—in the worst case from quadrant to quadrant. The measuring signals would thus be dependent on the position of the axis of rotation of the resolver rotor relative to the position of the center of the resolver stator, as a result of which a precise adjustment of the rotor and stator becomes necessary. The division into angle segments thus reduces the distortion of the measuring signal from the sine form and thereby reduces errors in the angle measurement. The magnetic separation solves the accuracy problem existing previously in arrangements according to the prior art. The increased error tolerance with regard to adjustment accuracy that is achieved by the present invention is thus based on the described modification of the magnetic circuit. A tightening of the tolerances in manufacture and assembly is not necessary for this.

According to one advantageous specific embodiment, the resolver stator is fastened to the bearing ring via a retaining element. The retaining element may preferably be easily manufactured as an injection-molded part.

In one advantageous specific embodiment, the resolver stator is fastened to the bearing outer ring and the resolver rotor is fastened to the bearing inner ring.

It has proven to be advantageous if the transmission and receiving coil is connected to a control and evaluation unit which serves to evaluate the signal delivered by the angle sensor. The control and evaluation unit is preferably situated outside of the angle sensor. Due to the spatial separation between the angle sensor and the control and evaluation unit, the resolver bearing is also particularly suitable for high operating temperatures.

The resolver stator according to the present invention has at least one transmission coil and at least one receiving coil which are designed as printed circuits on a multilayer circuit board, the transmission coil being situated at least partly within a U-shaped shell core and the receiving coil is situated partly within and partly outside of the shell core. The shell core is made up of magnetically conductive structures which are integrated into the multilayer circuit board. To this end, a magnetically conductive layer is preferably affixed to each of the outer layers of the multilayer circuit board, which are connected to one another via openings formed in the circuit board and filled with a magnetically conductive material, and one of the magnetically conductive layers having a recess for accommodating a resolver rotor.

By virtue of the combination, according to the present invention, of an electrical circuit board with magnetically conductive structures, it is possible to implement a resolver stator which is characterized in particular by a compact, space-saving design, as a result of which it is also possible to save costs.

The method according to the present invention includes the following steps: A multilayer circuit board is initially produced including at least one transmission coil designed as a printed circuit and at least one receiving coil designed as a printed circuit. A magnetically conductive layer is then suitably affixed to each of the outer layers of this multilayer circuit board. The magnetically conductive layers are preferably applied by lamination. Openings are then formed in the circuit board. Magnetically conductive material is then introduced into the openings, as a result of which the magnetically conductive layers are connected in a magnetically conductive manner. Finally, a recess which serves to accommodate a resolver stator is formed in one of the two magnetically conductive layers.

BRIEF DESCRIPTION OF THE DRAWINGS

Preferred specific embodiments of the present invention will be described in greater detail below with reference to the appended figures.

DETAILED DESCRIPTION

Figure 1:
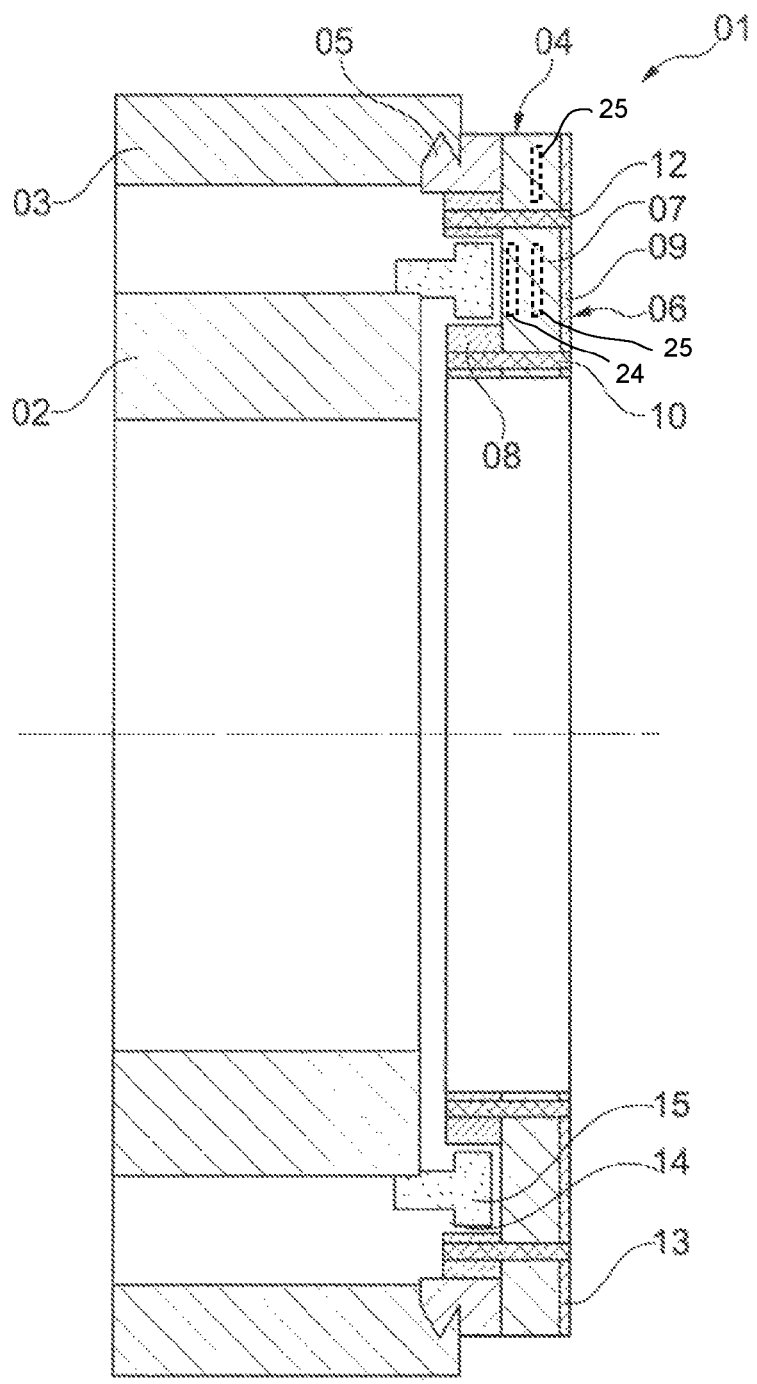
FIG. 1 shows a sectional view of a resolver bearing according to the present invention.

FIG. 1 shows a sectional view of a resolver bearing 01 according to the present invention. Resolver bearing 01 includes a bearing inner ring 02, a bearing outer ring 03 and also rolling bodies (not shown) which are situated between bearing inner ring 02 and bearing outer ring 03. Resolver bearing 01 furthermore includes an angle sensor 04 which is used to detect the angular position of bearing rings 02, 03 relative to one another. Angle sensor 04 includes an annular resolver stator 06 connected to bearing outer ring 03 via a retaining element 05.

Resolver stator 06 includes a multilayer circuit board 07. Multilayer circuit board 07 is made up of multiple superposed electrically conductive layers and dielectric layers which are situated between adjacent electrically conductive layers. At least one transmission coil 24 and at least one receiving coil 25 (schematically shown) are implemented in the form of printed circuits on the electrically conductive layers. Preferred are specific embodiments with four receiving coils. Alternatively, eight or twelve receiving coils 25 for example may also be used. Multilayer circuit board 07 is provided with a magnetically conductive layer 08, 09 on each of its two outer layers. The two magnetically conductive layers 08, 09 are connected to one another with the aid of magnetic vias 10, 12. Magnetic vias 10, 12 are produced by forming openings in circuit board 07 provided with magnetic layers 08, 09, which are filled with magnetically conductive material. Interconnected magnetically conductive layers 08, 09 form a shell core 13 which is U-shaped in cross-section.

Magnetically conductive layer 08 facing toward bearing rings 02, 03 includes a recess 14 for accommodating a resolver rotor 15. Resolver rotor 15 is designed as a ring in such a way that the difference between the internal and external diameter of the ring is different over the circumference, whereby preferably there is a circular inner circumference and an eccentric outer circumference. Resolver rotor 15 includes magnetically conductive components. It is fastened to bearing inner ring 02, preferably via a press-fit. Resolver rotor 15 is situated in such a way that its axis of rotation runs through the center of resolver stator 06. In the illustrated specific embodiment, the transmission coil 24 is situated completely within U-shaped shell core 13, while the receiving coil 25 is situated partly outside of and partly within U-shaped shell core 13. In alternative specific embodiments, the transmission coil 24 may also be situated only partly within U-shaped shell core 13.

A signal is transmittable between the transmission coil 24 and the receiving coil 25 with the aid of a magnetic circuit running via U-shaped shell core 13 and resolver rotor 15. An angular position-dependent variable reluctance in the magnetic circuit is established by resolver rotor 15. The transmission coil 24 and the receiving coil 25 are preferably connected to a control and evaluation unit (not shown) for appropriately evaluating the detected signals.

Figure 2:
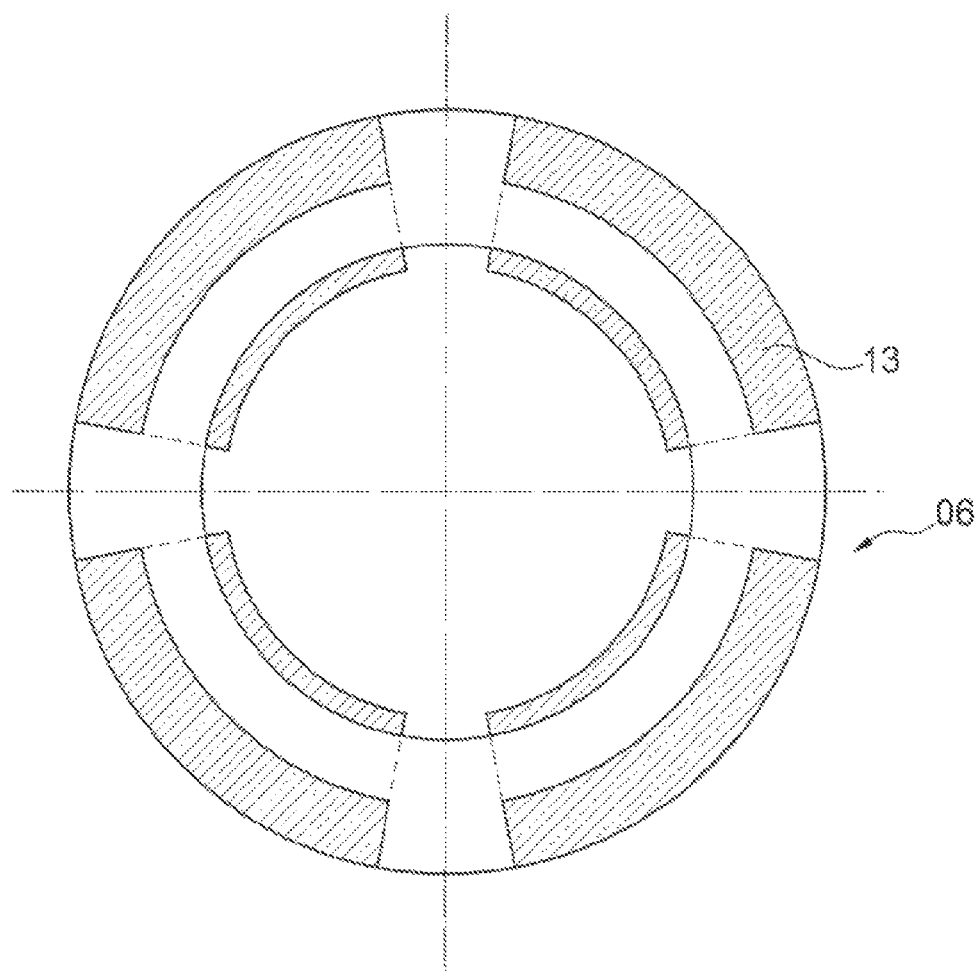
FIG. 2 shows a sectional view of a resolver stator according to the present invention.

FIG. 2 shows a sectional view of a resolver stator 06 according to the present invention. A specific embodiment is shown in which the magnetically conductive structures, i.e., the magnetically conductive layers forming shell core 13 and the magnetic vias, are made up of four angle segments of equal size. The individual angle segments are spaced apart from one another. The advantages of this specific embodiment with segmented magnetically conductive structures in comparison to specific embodiments with non-segmented magnetically conductive structures will be explained below with reference to FIGS. 3 and 4.

Figure 3:
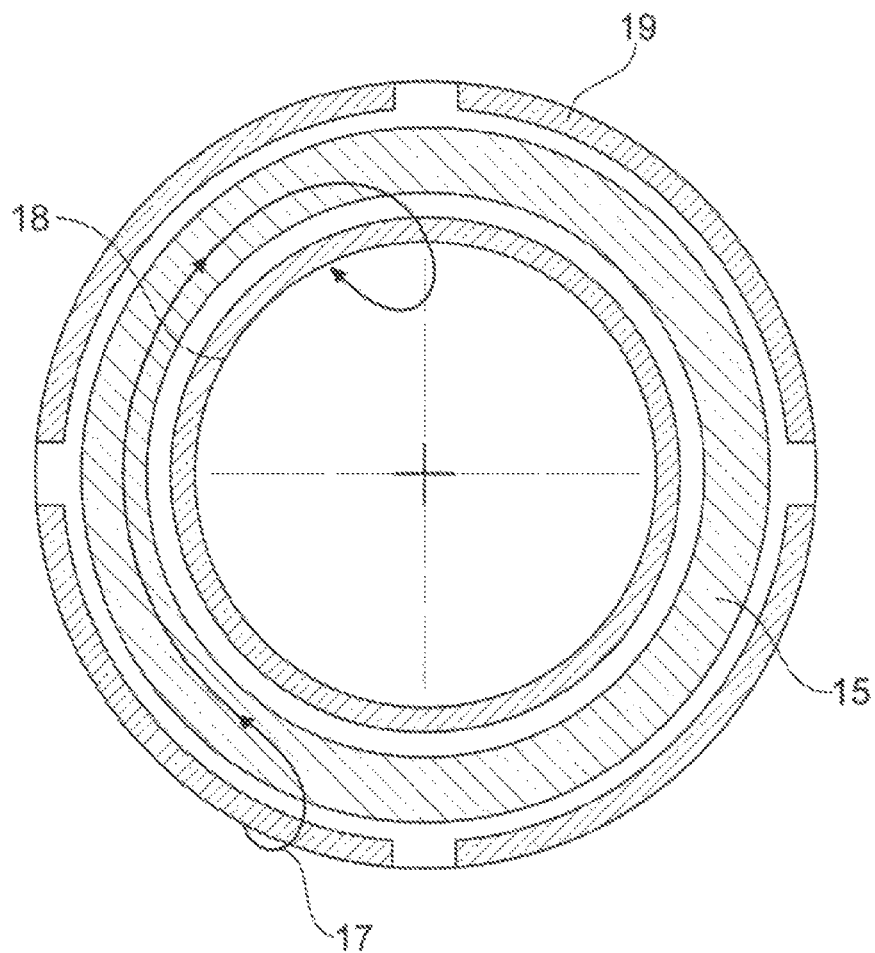
FIG. 3 shows a sectional view of an angle sensor in a first specific embodiment.

FIG. 3 shows an angle sensor 04 including non-segmented magnetically conductive structures. In the case of non-segmented magnetically conductive structures, an undesirable tangential magnetic flux 17 through the stator and rotor occurs, as a result of which the measuring signals of angle sensor 04 become dependent on the position of the axis of rotation of resolver rotor 15 relative to the position of the center of resolver stator 06. The measuring signals delivered by angle sensor 04 become distorted and therefore inaccurate.

Figure 4:
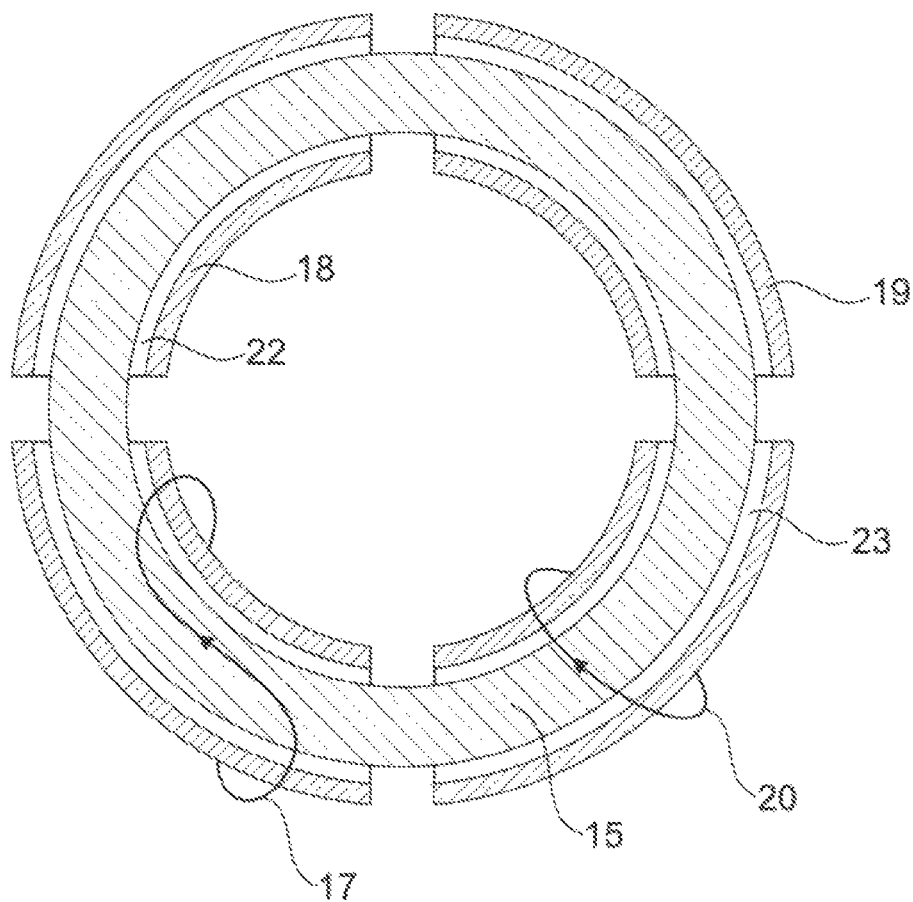
FIG. 4 shows a sectional view of the angle sensor in a second specific embodiment.

FIG. 4 shows an angle sensor 04 including segmented magnetically conductive structures. Here, due to the segments shortened in the circumferential direction, only a comparatively low tangential magnetic flux 17 occurs. Due to the division into segments, the magnetic resistance within one segment is much lower than the resistance at the transition between adjacent segments. As a result, a radial magnetic flux 20 will occur in particular, with the following course: radial inner shell core leg 18—first air gap 22—resolver rotor 06—second air gap 23—radial outer shell core leg 19. The magnetic resistance in this magnetic circuit is in this case essentially a series connection of the resistances of the two air gaps 22, 23 and shell core legs 18, 19. Given a constant spacing of shell core legs 18, 19, the magnetic resistance is independent of shifts of the axis of rotation of resolver rotor 15 relative to the position of the center of resolver stator 06, since the sum of the resistances of air gaps 22, 23 remains constant if the inner and outer shell core legs have the same length in the circumferential direction. The division into segments reduces the distortion of the measuring signal from the sine form and thereby reduces errors in the angle measurement.

LIST OF REFERENCES NUMERALS 01 resolver bearing
02 bearing inner ring
03 bearing outer ring
04 angle sensor
05 retaining element
06 resolver stator
07 circuit board
08 magnetically conductive layer
09 magnetically conductive layer
10 magnetic via
11 —
12 magnetic via
13 shell core
14 recess
15 resolver rotor
16 —
17 tangential magnetic flux
18 radially inner shell core leg
19 radially outer shell core leg
20 radial magnetic flux
21 —
22 first air gap
23 second air gap

The invention claimed is:

1. A resolver bearing comprising:
   an inner bearing ring;
   an outer bearing ring;
   rolling bodies situated between the inner and outer bearing rings; and
   an angle sensor to detect a relative angular position of the inner and outer bearing rings with respect to one another, the angle sensor including:
      an annular resolver stator connected to one of the inner and outer bearing rings and including at least one transmission coil and at least one receiving coil designed as printed circuits on a multilayer circuit board, the transmission coil being situated at least partly within a U-shaped shell core and the receiving coil is situated partly within and partly outside of the shell core,
      a resolver rotor connected rotatably fixed to the other of the inner and outer bearing rings and including magnetically conductive components, the resolver rotor being designed as a ring in such a way that a difference between an internal and external diameter of the ring is different over the circumference, the resolver rotor being situated at least partly within the U-shaped shell core, an axis of rotation of the resolver rotor running through a center of the resolver stator,
      a signal being transmittable between the transmission coil and the receiving coil via a magnetic circuit, and an angular position-dependent variable reluctance in the magnetic circuit being established by the resolver rotor,
      the shell core of the angle sensor being made up of magnetically conductive structures integrated into the multilayer circuit board including a first magnetically conductive layer facing toward the inner and outer bearing rings having a recess for accommodating the resolver rotor.

2. The resolver bearing as recited in claim 1 wherein the first magnetically conductive layer is affixed to a first outer layer of the multilayer circuit board, the shell core including a second magnetically conductive layer affixed to a second outer layer of the multilayer circuit board, the first and second magnetically conductive layers being connected to one another via openings formed in the circuit board and filled with magnetically conductive material.

3. The resolver bearing as recited in claim 1 wherein the magnetically conductive structures are made up of multiple spaced-apart angle segments.

4. The resolver bearing as recited in claim 3 wherein the magnetically conductive structures are made up of four segments of equal size.

5. The resolver bearing as recited in claim 1 wherein the magnetically conductive components of the resolver rotor are made up of multiple spaced-apart angle segments.

6. The resolver bearing as recited in claim 1 wherein the resolver stator is fastened to the one of the inner and outer bearing rings via a retaining element.

7. The resolver bearing as recited in claim 1 wherein the resolver stator is fastened to the outer bearing ring and the resolver rotor is fastened to the inner bearing ring.

8. The resolver bearing as recited in claim 1 wherein the transmission coil and the receiving coil are connected to a control and evaluation unit.

9. A resolver stator comprising:
   at least one transmission coil and at least one receiving coil designed as printed circuits on a multilayer circuit board, the transmission coil being situated at least partly within a U-shaped shell core and the receiving coil being situated at least partly within and partly outside of the shell core,
   the shell core being made up of magnetically conductive structures integrated into the multilayer circuit board, a magnetically conductive layer being affixed to each of outer layers of the multilayer circuit board, the magnetically conductive layers being connected to one another via openings formed in the circuit board, the openings filled with magnetically conductive material, and one of the magnetically conductive layers having a recess for accommodating a resolver rotor.

10. A method for manufacturing a resolver stator as recited in claim 9, comprising the following steps:
    providing the multilayer circuit board including the at least one transmission coil designed as a printed circuit and the at least one receiving coil designed as a printed circuit;
    affixing the magnetically conductive layer to each of the outer layers of the multilayer circuit board;
    forming the openings in the multilayer circuit board;
    introducing the magnetically conductive material into the openings; and
    forming the recess in the one magnetically conductive layer.

* * * * *